(12) United States Patent
Hopper et al.

(10) Patent No.: US 8,042,260 B2
(45) Date of Patent: Oct. 25, 2011

(54) METHODS OF FORMING INDUCTORS ON INTEGRATED CIRCUITS

(75) Inventors: Peter J. Hopper, San Jose, CA (US);
Peter Johnson, Sunnyvale, CA (US);
Peter Smeys, Mountain View, CA (US);
Andrei Papou, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 423 days.

(21) Appl. No.: 12/250,385

(22) Filed: Oct. 13, 2008

(65) Prior Publication Data

US 2009/0038142 A1      Feb. 12, 2009

Related U.S. Application Data

(62) Division of application No. 11/621,424, filed on Jan. 9, 2007, now Pat. No. 7,468,899.

(51) Int. Cl.
*H01F 7/06* (2006.01)
(52) U.S. Cl. ......... 29/606; 29/605; 29/607; 29/829; 29/832; 216/62; 216/65; 216/66; 216/67; 336/178; 336/200; 336/212; 336/223; 336/232
(58) Field of Classification Search .......... 29/602.1, 29/605–607, 829, 832; 216/62, 65, 66, 67; 336/178, 200, 212, 223, 232
See application file for complete search history.

(56) References Cited

U.S. PATENT DOCUMENTS

| | | | |
|---|---|---|---|
| 5,204,809 A | 4/1993 | Andersen | |
| 5,869,148 A | 2/1999 | Silverscholtz et al. | |
| 6,466,401 B1 * | 10/2002 | Hong et al. | 360/123.25 |
| 6,867,903 B2 | 3/2005 | Imajuku et al. | |
| 6,943,535 B1 | 9/2005 | Schiff | |
| 7,002,325 B2 | 2/2006 | Harris et al. | |
| 7,012,414 B1 | 3/2006 | Mehrotra et al. | |
| 7,061,359 B2 | 6/2006 | Ding et al. | |
| 7,176,662 B2 | 2/2007 | Chandrasekaran | |
| 7,268,410 B1 | 9/2007 | Hopper et al. | |
| 7,292,128 B2 | 11/2007 | Hanley | |
| 7,319,572 B2 * | 1/2008 | Iltsuka et al. | 360/123.01 |
| 2002/0097129 A1 | 7/2002 | Johnson | |
| 2004/0123449 A1 * | 7/2004 | Inaguma | 29/603.24 |

OTHER PUBLICATIONS

U.S. Appl. No. 11/274,932, filed Nov. 14, 2005.
U.S. Appl. No. 10/658,433, filed Sep. 8, 2003.
U.S. Appl. No. 11/111,660, filed Apr. 21, 2005.
U.S. Appl. No. 11/137,767, filed May 25, 2005.
U.S. Appl. No. 11/495,143, filed Jul. 27, 2006.
U.S. Appl. No. 11/504,972, filed Aug. 15, 2006.
"The Concise Colour Science Dictionary", Oxford University Press, 1997, p. 708.

* cited by examiner

*Primary Examiner* — Paul D Kim
(74) *Attorney, Agent, or Firm* — Beyer Law Group LLP

(57) ABSTRACT

The claimed invention pertains to methods of forming one or more inductors on a semiconductor substrate. In one embodiment, a method of forming an array of inductor core elements on a semiconductor substrate that includes integrated circuits is disclosed. A first set of spaced apart metallic core elements are formed over the substrate. Isolation sidewalls are then formed on side surfaces of the core elements. Afterward, a second set of metallic core elements are formed over the substrate. The first and second sets of core elements are substantially co-planar and interleaved such that only the isolation sidewalls separate adjacent core elements. Particular embodiments involve other processing operations, such as the selective electroplating of different types of metal to form core elements and/or the deposition and etching away of an isolation layer to form isolation sidewalls on the core elements.

23 Claims, 8 Drawing Sheets

METHODS OF FORMING INDUCTORS ON INTEGRATED CIRCUITS

CROSS-REFERENCE TO A RELATED APPLICATION

This application is a divisional application claiming priority to U.S. patent application Ser. No. 11/621,424 filed Jan. 9, 2007, now U.S. Pat. No. 7,468,899 ,entitled "Apparatus and Method for Wafer Level Fabrication of High Value Inductors on Semiconductor Integrated Circuits."

BACKGROUND

1. Field of the Invention

The present invention relates to wafer level fabrication of high value inductors on semiconductor integrated circuits, and more particularly, to the optimization of power inductor arrays on integrated circuits for switching regulator applications.

2. Background of the Invention

Inductors are commonly used in the electronics industry for storing magnetic energy. Providing an electric current though a metal conductor, such as a metal plate or bar, typically creates an inductor. The current passing though the metal conductor creates a magnetic field or flux around the conductor. The amount of inductance is measured in terms of Henries. In the semiconductor industry, it is known to form inductors on integrated circuits. The inductors are typically created by fabricating what is commonly called an "air coil" inductor on the chip. The air coil inductor is usually either aluminum or some other metal patterned in a helical, toroidal or a "watch spring" coil shape. By applying a current through the inductor, the magnetic flux is created.

Inductors are used on chips for a number of applications. Perhaps the most common application is DC-to-DC switching regulators. In many situations, however, on chip inductors do not generate enough flux or energy for a particular application. When this occurs, very often an off-chip discrete inductor is used.

There are a number of problems in using off-chip inductors. Foremost, they tend to be expensive. With advances in semiconductor process technology, millions upon millions of transistors can be fabricated onto a single chip. With all these transistors, designers have been able to cram a tremendous amount of functionality onto a single chip and an entire system on just one or a handful of chips. Providing an off-chip inductor can therefore be relatively expensive compared to the overall cost of the system. Off-chip inductors can also be problematic in situations where space is at a premium. In a cell phone or personal digital assistant (PDA) for example, it may be difficult to squeeze a discrete inductor into a compact package. As a result, the consumer product may not be as small or compact as desired.

Methods for forming one or more inductors on a semiconductor substrate are therefore needed.

SUMMARY OF THE INVENTION

The claimed invention pertains to methods of forming one or more inductors on a semiconductor substrate. In one embodiment, a method of forming an array of inductor core elements on a semiconductor substrate that includes integrated circuits is disclosed. A first set of spaced apart metallic core elements are formed over the substrate. Isolation sidewalls are then formed on side surfaces of the core elements. Afterward, a second set of metallic core elements are formed over the substrate. In some embodiments, at least one core element of the second set of core elements is positioned in a space between an associated adjacent pair of core elements from the first set of core elements. The first and second sets of core elements are substantially co-planar and interleaved such that only the isolation sidewalls separate adjacent core elements.

In another embodiment, a metal seed layer is formed over a semiconductor substrate. A layer of photoresist is deposited over the metal seed layer. The photoresist is patterned using lithographic techniques to form recesses in the photoresist that expose portions of the metal seed layer. A first metal material is electroplated into the recesses to form a first set of spaced apart core elements. A conformal isolation layer is deposited over the substrate after the first set of core elements have been formed so that the isolation layer covers surfaces of the core elements and regions between the core elements. As a result, isolation sidewalls are formed on each of the core elements. Portions of the isolation layer that cover regions between core elements are etched away to expose portions of the metal seed layer without removing the isolation sidewalls. Afterward, a second metal material is electroplated after the isolation layer etching to form a second set of metallic core elements. The first and second sets of core elements are substantially co-planar and interleaved such that only the isolation sidewalls separate adjacent core elements.

BRIEF DESCRIPTION OF THE DRAWINGS

Like elements are designated by like reference numbers in the Figures.

DETAILED DESCRIPTION OF THE PREFERRED EMBODIMENTS

Figure 1A:
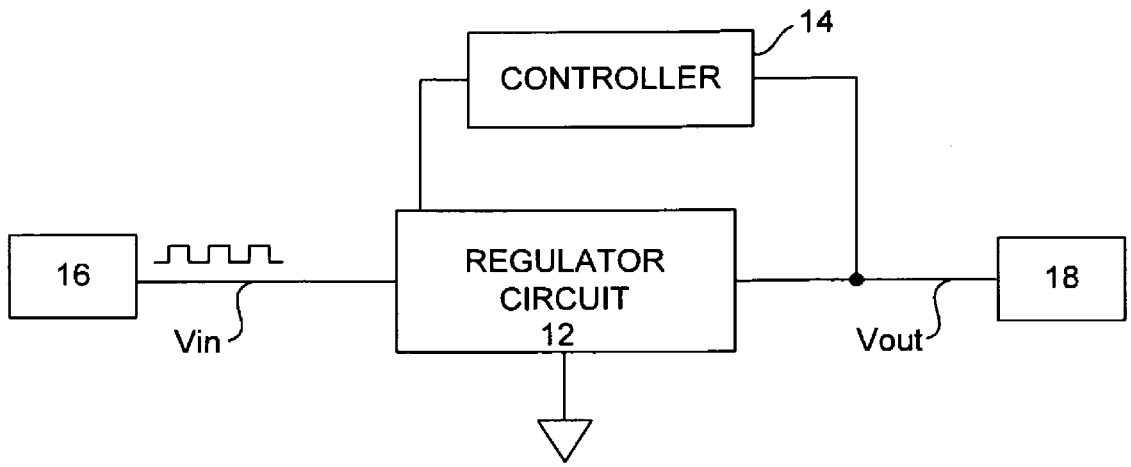
FIG. 1A is a block diagram of power regulator system.

Referring to FIG. 1A, a block diagram of a common power regulator system is shown. The system 10 includes a regulator circuit 12 and a controller 14 coupled between a power supply 16 and a device 18, such as micro-controller, that requires a steady direct current (DC) voltage. The regulator circuit 12 includes an inductor (L) and a core (both not illustrated). The input voltage Vin is typically a pulsed input signal from the power supply 16 having a frequency (f) and an amplitude equal to Vin. With each positive and negative pulse transition, the inductor is cyclically energized and then de-energized, causing the flux in the core to increase and then decrease respectively. The output Vout of the regulator circuit 12 is coupled to the device 18. Ideally, the output voltage is steadily maintained at the desired output voltage. If the output voltage strays, the controller 14 causes the frequency (i.e., sometimes referred to as the duty cycle) of the pulses of the input voltage Vin to either increase or decrease as needed to maintain a steady output voltage.

$\Delta V$ is a measure of the input voltage Vin minus the output voltage Vout. This relationship can be expressed by equation (1) below:

$$\Delta V = V\text{in} - V\text{out} \quad (1)$$

$\Delta V$ can also be expressed as the rate of change of current over time through the inductor (L). This relationship is expressed by equation (2) below:

$$\Delta V = L\, di/dt \quad (2)$$

$\Delta V$ can further be expressed in terms of the switching frequency (f) of the input voltage Vin. This relationship is expressed by equation (3) below:

$$\Delta V = L/f \quad (3)$$

Figure 1B:
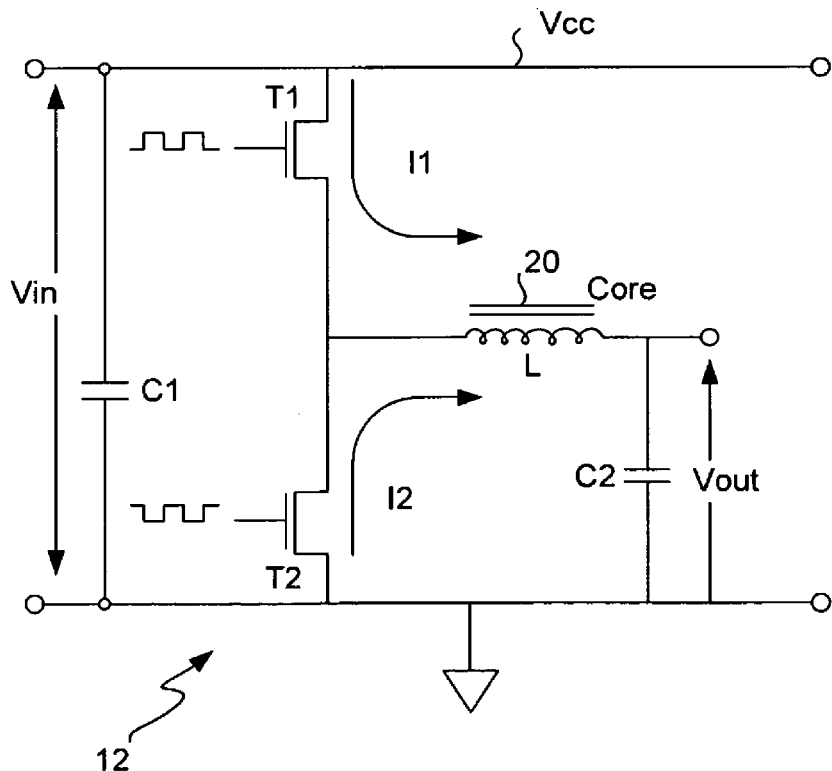
FIG. 1B is a circuit diagram of a power regulator circuit.

Referring to FIG. 1B, a circuit diagram of the regulator 12 is shown. The circuit 12 includes two transistors T1 and T2 with their channels coupled in series between Vcc and ground. A first capacitor C1 is also coupled between Vcc and ground in parallel with the channels of transistors T1 and T2. One end of the inductor coil L is coupled between the two transistors T1 and T2 and the opposite end is coupled to the output node Vout. A core 20 is provided adjacent the inductor L. A second capacitor C2 is coupled between the output node Vout and ground. The gate of transistor T1 is coupled to receive the pulsed input signal Vin. The gate of transistor T2 is coupled to receive the complement of signal Vin. The instantaneous energy E in the inductor L is defined by equation (4) below:

$$E = \int BH dh \quad (4)$$

Where B is the flux density or Webers per cm2; and
  H is the magnetic field intensity The regulator circuit 12 operates in alternating high and low phases. During the high phase, a positive voltage pulse of Vin is applied to the gate of transistor T1, while a complementary or negative pulse is applied to the gate of transistor T2. This causes transistor T1 to turn on and transistor T2 to turn off. With transistor T1 on, current is pulled through transistor T1 from Vcc to energize the coil of inductor L, creating a flux in the core 20. The low phase occurs when the input pulse transitions low at the gate of transistor T1 and high at the gate of transistor T2. When this occurs, the transistor T1 turns off and transistor T2 turns on. As a result, the inductor L pulls current from ground through transistor T2, causing the inductor to de-energize and the flux in the core 20 to collapse. The aforementioned cycle is repeated with each pulse of Vin and the complement is applied to transistors T1 and T2. The output of the circuit 12 is ideally a steady voltage. Due to the cyclical increases and decreases of the energy in the inductor L and the flux in the core 20, the output voltage Vout will typically have a ripple. The output capacitor C2 is provided to smooth out the ripple.

Figure 2A:
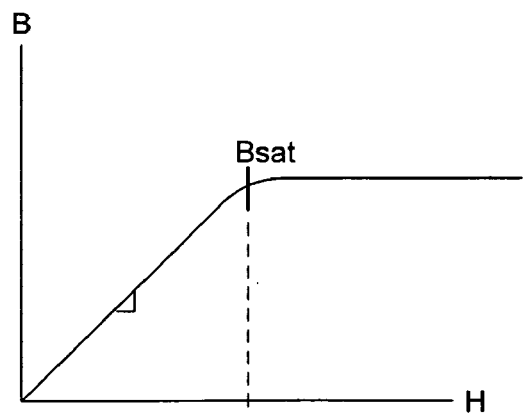
FIGS. 2A is a plot illustrating the relationship between flux density versus magnetic field intensity in the inductor and core of the power regulator circuit of FIG. 1B.

Referring to FIG. 2A, a plot illustrating the relationship between the flux density as measured in Webers per cm$^2$ (B) versus the magnetic field intensity as measured in ampere turns per meter (H) in the inductor L and core 20 is shown. As evident in the figure, as the magnetic field H increases, the flux density B increases, until the saturation point "Bsat". Once Bsat is reached, the magnetic flux B remains generally constant, even with an increase in the magnetic field density. The slope of the plot or curve, calculated by B/H, defines the permeability (i.e., the propensity) of the material of the core 20 to become magnetized. Bsat is thus defined as the point where the maximum state of magnetization or flux of the material of the core 20 is achieved. In other words, the point where the curve rolls off to a minimum slope represents the flux density saturation point (Bsat). Bsat varies from material to material. For example, Iron has a high level of permeability, whereas other materials such as FeNi (permalloy) have a relatively low permeability. The higher the permeability slope the greater the ability of the system to store magnetic flux, and hence energy for a given inducing current, or magnetic field.

Figure 2B:
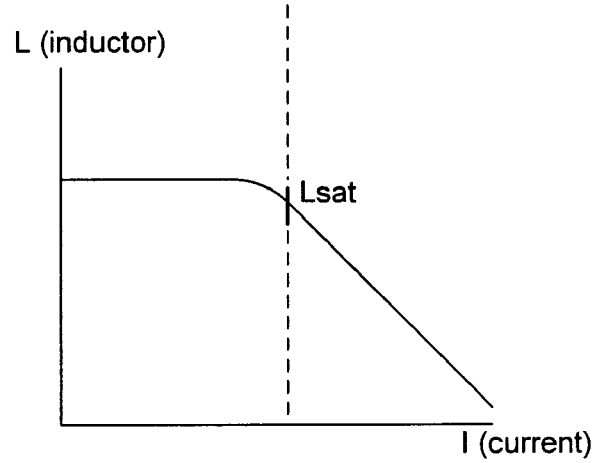
FIG. 2B, a plot illustrating the relationship between the inductance and the current in the coil of the power regulator circuit of FIG. 1B.

Referring to FIG. 2B, a plot illustrating the relationship between the inductance (L) and the current (I) in the coil L is shown. With a relatively small current, the inductance L is high. As the current increases, the inductance L drops off until the saturation point Lsat is reached. FIG. 2B represents the derivative of H and B, and is plotting the slope of FIG. 2A. Inductance then, relates to the derivative of B and H or in other words is proportional to the permeability. The inductance rolls off at the point following the magnetic saturation of the core material.

The issue with common regulator circuits is that it has been difficult to fabricate cores 20 of sufficient size on an integrated circuit. The solution in the past has typically been to use an off-chip or discrete core. With the present invention, however, the core is fabricated on chip as described in detail below.

Figure 3:
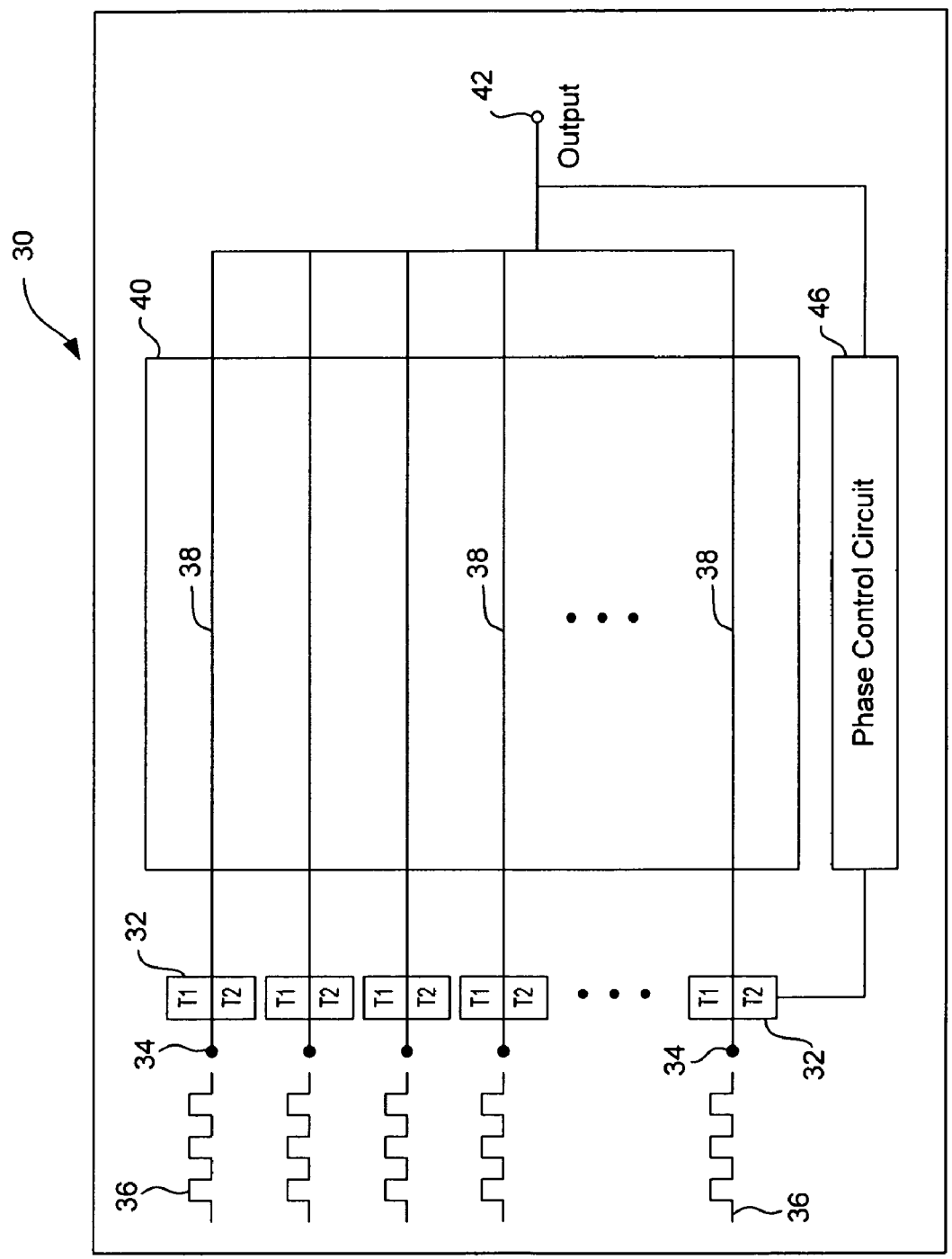
FIG. 3 is a block diagram of a semiconductor chip having a power regulator circuit fabricated thereon according to the present invention.

Referring to FIG. 3, a block diagram of an integrated circuit formed on a semiconductor chip having a power regulator circuit fabricated thereon according to the present invention is shown. The integrated circuit 30 includes a plurality of regulator circuits 32 each having an input node 34 configured to receive complementary pulsed input signals 36 respectively (for the sake of simplicity, only the positive pulsed signal is shown). A plurality of inductor core windings 38 is associated with each of the plurality of regulator circuits 32. The regulator circuits 32 are each identical to that illustrated in FIG. 1B with the exception of the core 20. Rather than a specific core 20 associated with each circuit 32, an engineered distributed core array 40 is provided for all of the regulator circuits 32. The core array 40, including a plurality of core elements (not illustrated), is positioned adjacent to and is magnetically coupled to each of the inductor windings 38. An output node 42 is electrically coupled to the plurality of inductor windings 42. A phase control circuit, connected between the output node 42 and the regulator circuits 32, is provided to control the phase of each of the input signals 36.

The general principle of the present invention is the combined use of phased multiple driver circuits 32, each driving one or more core elements of the core array 40. The greater the degree of the sharing among the core elements of the array 40 by the phased driver circuits, the higher the overall level of saturation of the core 40 can be achieved. By engineering the length, width, and types of materials used to fabricate the core elements of the core 40 and the windings 38, energy storage can be maximized while minimizing core losses.

It should be noted FIG. 3 as illustrated is figurative in the sense that it shows the regulator circuit of the present invention occupying virtually all of the area on the surface of the integrated circuit chip. It should be understood, however, that it is intended that the regulator circuitry of the present invention be fabricated on a chip along with other circuitry. In various embodiments, the other circuitry can include a wide variety of functions, such as a microprocessor or microcontroller, digital signal processing, memory or just about any other analog or digital circuitry commonly found on semiconductor integrated circuits. In other words, the power regulator of the present invention may be fabricated on and used on virtually any semiconductor integrated circuit.

Referring to FIGS. 4A through 4D, various embodiments of the engineered core array 40 are shown.

Figure 4A:
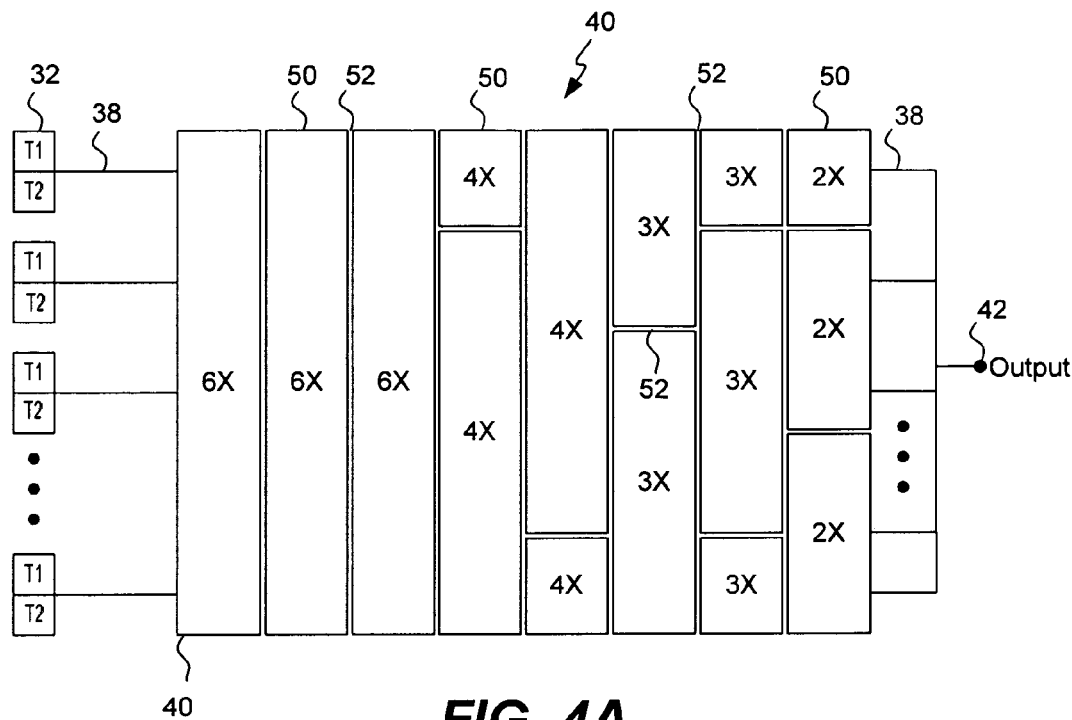
FIGS. 4A through 4D illustrate various embodiments of a core array of the power regulator circuit according to the present invention.

Referring to FIG. 4A, an embodiment of the core array 40 is shown. Core array 40 includes a plurality of core elements 50, which are separated by spacers 52. The purpose of the spacer 52 is to prevent eddy currents between the elements 50. As illustrated in the figure, each of the elements 50 is positioned adjacent to and is magnetically coupled to one or more of the inductor windings 38, which are electrically coupled between the plurality of regulator circuits 32 and the output node 42 respectively. In this embodiment, each of the core elements 50 is of the same width. The length of the core elements 50, however, varies. In the embodiment illustrated, the three left most core elements 50 each have a length of six times (6×) a predetermined unit length and are in a non-staggered pattern with respect to one another. The remaining core elements 50, on the right side of the array, are of different lengths and arranged in a staggered pattern. In the specific embodiment shown, the core elements 50 are four, three or two times (4×, 3×, and 2×) the predetermined length. The length of the elements 50 becomes shorter as a function of the length of the winding 38. In an alternative embodiment, the length of the elements 50 can become longer as a function of the length of the windings.

In various embodiments, the predetermined length of the elements may range from 1 um to 10 mm and the core elements 50 may range from two to 100 times the predetermined length. In yet another embodiment, all of the core elements 50 of the core array 40 can be of various lengths and arranged in a staggered pattern.

Figure 4B:
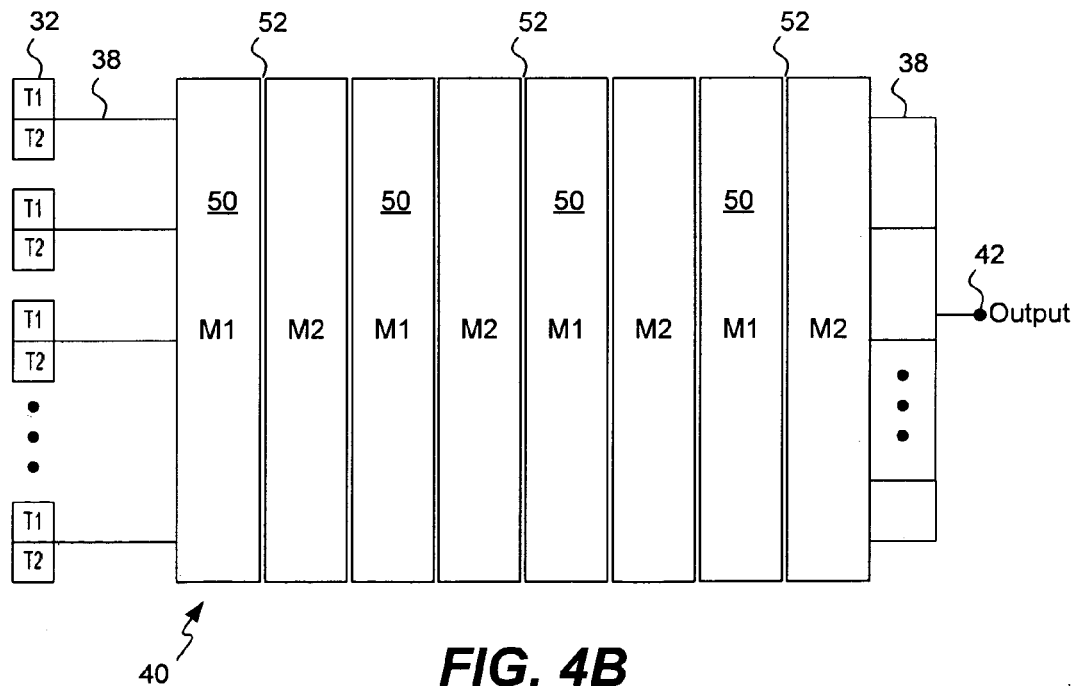

Referring to FIG. 4B, an embodiment of the core array 40 with a plurality of the core elements 50 is shown. The plurality of the core elements 50 are made from two different types of metals, M1 and M2, which have different coercivities. In this embodiment, each of the core elements 50 are of the same length and width and are arranged in a parallel, non-staggered pattern. A spacer 52 separates the core elements 50. In the embodiment shown, the core elements 50 are divided into first and second subsets. The first subset of core elements 50 are made from a first metal M1, such as nickel-iron permalloy, or any ferromagnetic material with a relatively low coercivity (Hc). The second subset of core elements 50 are made from a second metal M2 having a higher coercivity, such as colbalt-nickel-iron or materials rich in Fe. The individual cores 50 of the first and second subsets M1 and M2 are arranged in an alternating pattern. The metal arrangement of M1 and M2, separated by spacers 52, is distributed along the length of the inductors.

Figure 4C:
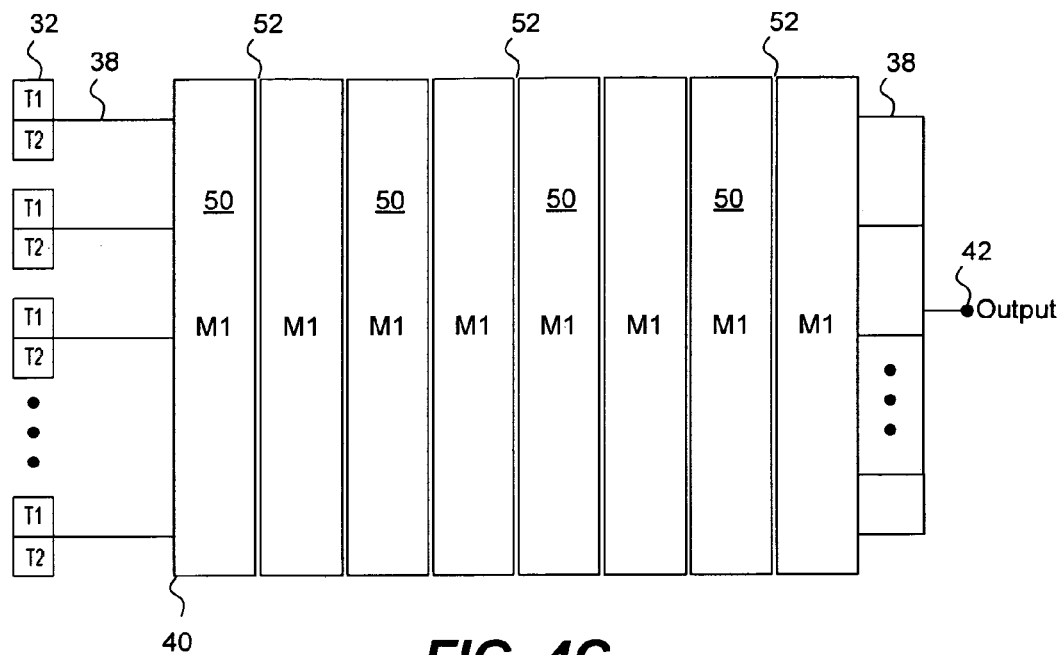

Referring to FIG. 4C, an embodiment of the core array 40 including a plurality of the core elements 50 made from the same metal is shown. In this embodiment, each of the core elements 50 are the same length and width and are arranged in a parallel, non-staggered pattern. Spacers 52 also separate each of the core elements 50.

Figure 4D:
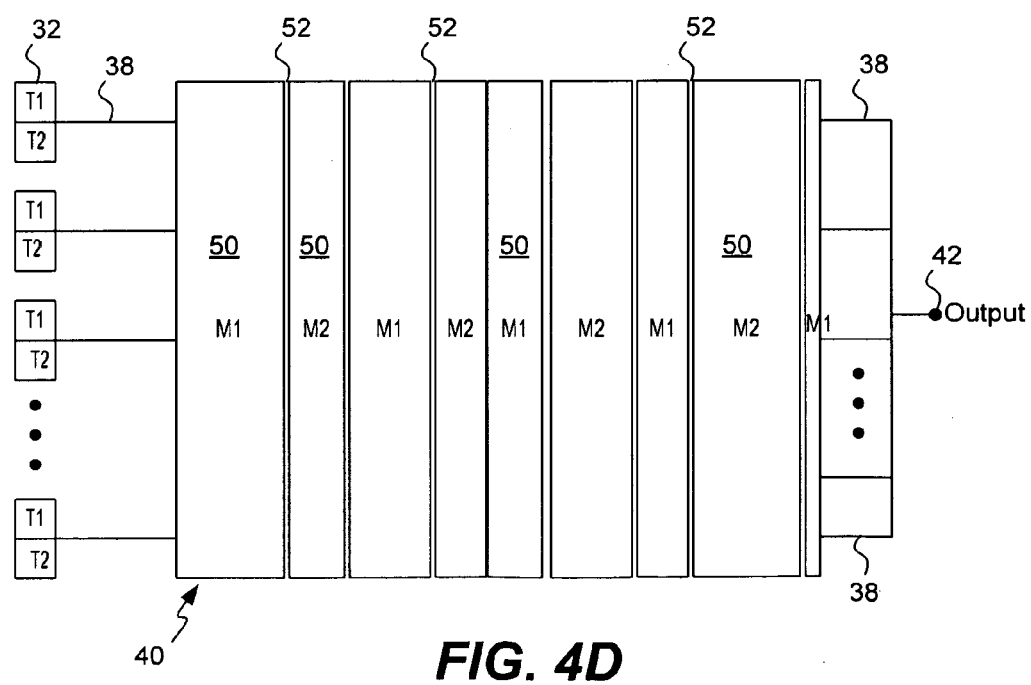

Referring to FIG. 4D, another embodiment of the core array 40 including a plurality of the core elements 50 made from two different types of metals M1 and M2 of different coercivity is shown. In this embodiment, each of the core elements 50 is of the same length, but different widths. The core elements 50 are also arranged in a parallel, non-staggered, pattern. A spacer 52 separates the core elements 50. With this arrangement, a majority of the first subset of core elements 50 made from the first metal M1 with a lower coercivity are located near the regulator circuits 32 and minority is located near the output node 42. A majority of the second subset of core elements 50 made from the second metal M2 with a higher coercivity are located near the output node 42 and a minority are located near the regulator circuits 32. With this embodiment, the benefits of the two metals M1 and M2 with their different B/H curves are exploited. For example, at the input of the core array 40, there is a relatively large alternating current component on the input signals provided onto the inductor windings 38. It is therefore advantageous to use a low coercivity metal, which provides a lower level of energy storage. On the other hand, the signal on the inductor windings 38 near the output node 42 has a relatively higher direct current component. The use of a metal capable of a higher degree of energy storage, such as cobalt-nickel-iron, is therefore beneficial.

At the switching node or input node 34 near the transistors T1 and T2 along the windings 38, there is a relatively large level of ripple. In one embodiment, the core 40 is therefore engineered to be weighted with high resistivity (to minimize eddy currents) and low coercivity (to minimize hysterisis losses) elements 50 near the driver circuits 32. The trade-off of this arrangement, however, is reduced permeability and Bsat. At the output node 42 on the other hand, there is less ripple voltage. Consequently, the elements 50 of the core 40 near the output can be weighted with elements 50 having a higher Bsat and cooercivity material, while trading off higher conductivity and coercivity.

It should be noted again that the embodiments shown in FIGS. 4A through 4D are merely exemplary. The number, length, width, pattern (staggered, non-staggered, or a combination thereof), types of metals, and specific arrangement of the individual core elements 50 can be selected in a wide combination of different designs, depending on a specific application. In no way should the specific arrangements as illustrated be construed as limiting the invention.

Figure 5:
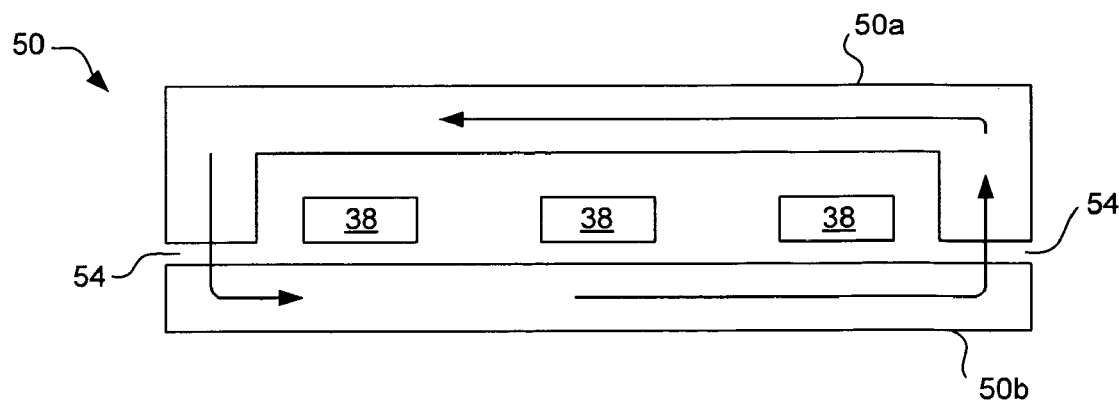
FIG. 5 illustrates a cross section of a core element of the core array according to the present invention.

Referring to FIG. 5, a cross section of a core element 50 of the core array 40 according to the present invention is shown. Each of the core elements 50 includes a first core member 50a positioned adjacent to and above the windings 38 and a second member 50b positioned adjacent to and below the core windings 38. Together, the first core member 50a and the second core member 50b substantially form a loop around the core windings 38. A gap 54 is provided between the first and second members 50a and 50b. The gap allows a drop in the magnetic field between the two members 50a and 50b. In the particular embodiment shown, the core element 50 has a length that spans three windings 38. With this arrangement, each of the three windings 38 is magnetically coupled by the one core element 50. It should be understood, however, that this length is arbitrary and that the two members 50a and 50b of each core element 50 may be fabricated to span any number of windings 38.

Figure 6A:
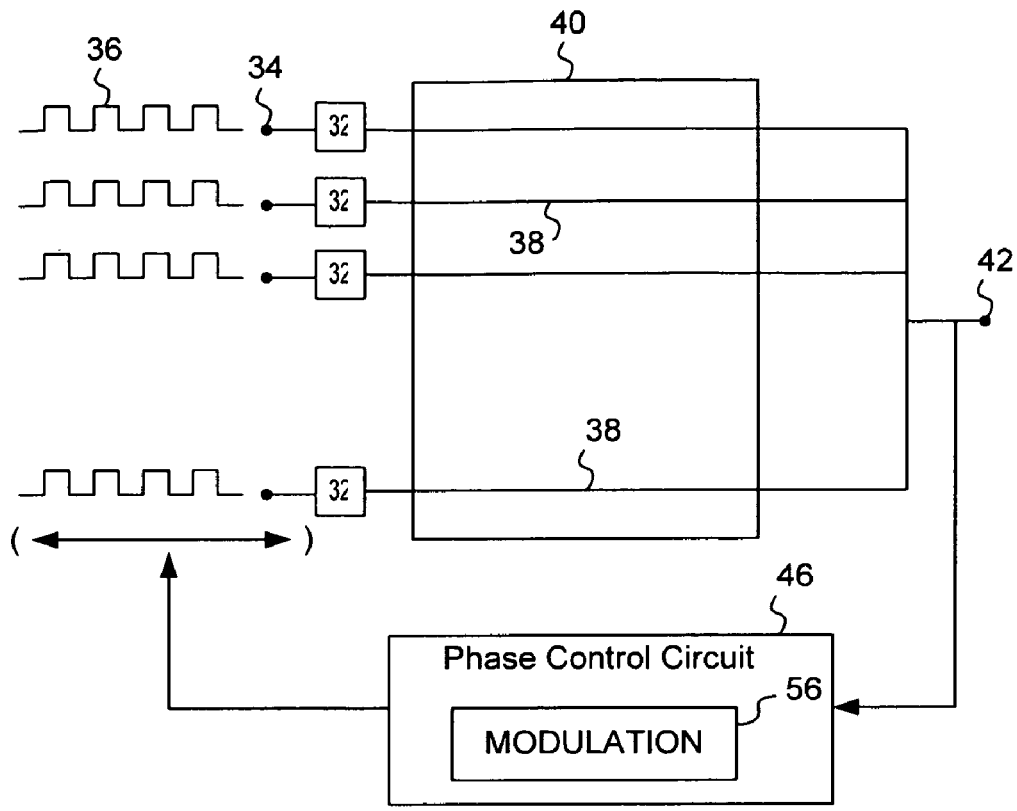
FIG. 6A is a block diagram of the phase control circuit used in the regulator circuit of the present invention.

Referring to FIG. 6A, a block diagram of the phase control circuit 46 of the present invention is shown. The phase control circuit 46 controls the phase of the plurality of pulsed input signals so that each is 360 degrees/N out of phase with respect to one another, where N equals the number of the regulator circuits 32. For example, if there are one hundred regulator circuits 32 (N=100), then the phase control circuit 46 controls the input signals 36 so that they are each 3.6 degrees out of phase with respect to one another. With this arrangement, any voltage ripple on the individual windings 38 tend to destructively interfere with one another, substantially cancelling each other out in the aggregate. As a result, a generally steady output voltage at the output node 42 is generated, which is the sum of the instantaneous voltage on each of the plurality of inductor windings respectively. Since the output signal at node 42 is relatively ripple-free and steady, the smoothing capacitor C2 can be either eliminated altogether or the size of the input capacitor C1 and, to some degree, the output capacitor C2 can be significantly reduced.

Figure 6B:
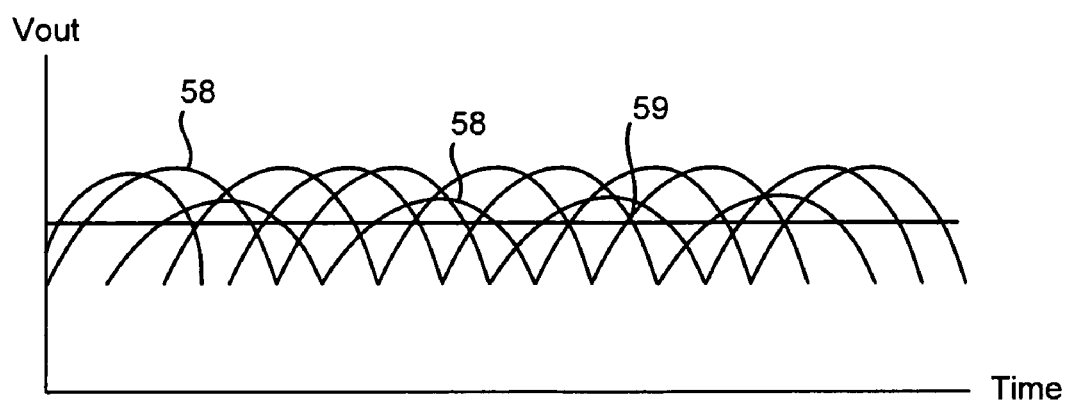
FIG. 6B is a diagram showing an output signal at the output node of the regulator circuit of the present invention.

Referring to FIG. 6B, a diagram plotting the output voltage at the output node 42 over time is shown. The diagram illustrates a number of signals 58, each of which is representative of the voltage on the individual windings 38. As can be seen in the figure, the individual signals 58 are out of phase with respect to one another. As a result, the voltage ripple on the individual windings 38 tend to cancel each other out under low load conditions. Similarly the referred ripple to the input power supply are cancelled to a significant degree. The sum of the instantaneous voltage 58 on each of the plurality of inductor windings 38, however, is a relatively constant with the cancellation effect. The net result is a steady output signal or voltage 59 at the output node 42, represented by the thick black line in FIG. 6B.

Furthermore, with the arrangement the core elements 50 each spanning one or more windings 38, the magnetic coupling tends to average out or be substantially evenly shared or distributed across the core array 40. As a net result, the amount of magnetization "ripple" across the windings 38 is further minimized, resulting in a more steady output voltage signal at the node 42. Without this distributed coupling across the array 40, the individual core elements 50 would experience a greater level of magnetization ripple, leading to a higher level of hysteresis, radiative and eddy current related loss factors. As a result, the size of smoothing capacitor at the output node and input node 42 may be significantly reduced or eliminated all together.

The phase control circuit 46 also optionally includes a modulation circuit 56. The modulation circuit is configured to modulate the phase differences between the plurality of pulsed input signals 36 to either increase or decrease the transient current demands at the output node 42. Meeting high speed transient demand is often a challenge from a design perspective. By modulating the phase difference, typically for short periods of time, a transient surge in energy demand can be achieved. This phase modulation or short-term frequency modulation scheme thus enables spontaneous maximization of the energy transfer from the core to the output node.

Referring to FIGS. 7A-7H, a sequence of cross sections of a semiconductor substrate (e.g., a wafer) illustrating how the core elements 50 of the core array 40 are fabricated is shown.

Figure 7A:
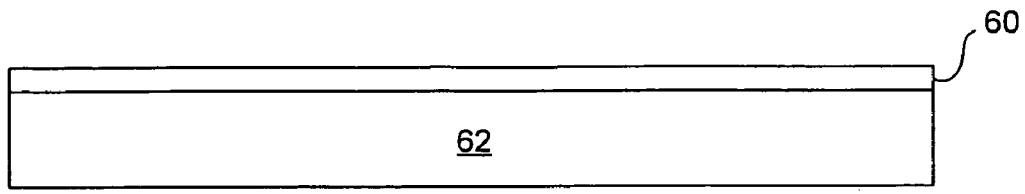
FIGS. 7A-7H are a sequence of cross sections of a semiconductor chip illustrating the sequence of fabricating core elements of the core array used in the regulator circuit of the present invention.

In FIG. 7A, a seed layer 60 is formed over a substrate 62 in the location where the core elements 50 of the array 40 are to be formed. According to one embodiment, the seed layer 60 actually includes three layers of metal, for example, a Ti—Cu—Ti or Ti—FeNi—Ti, formed over the substrate surface by either sputtering or physical vapor deposition.

Figure 7B:
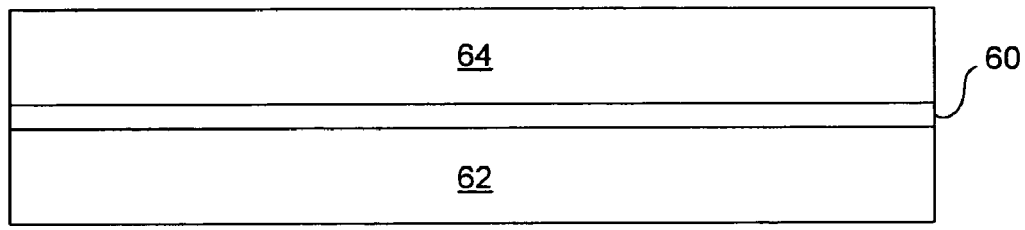

In the next step as illustrated in FIG. 7B, a blanket layer of molding material 64, such as photoresist or BCB, is applied over the seed layer 60.

Figure 7C:
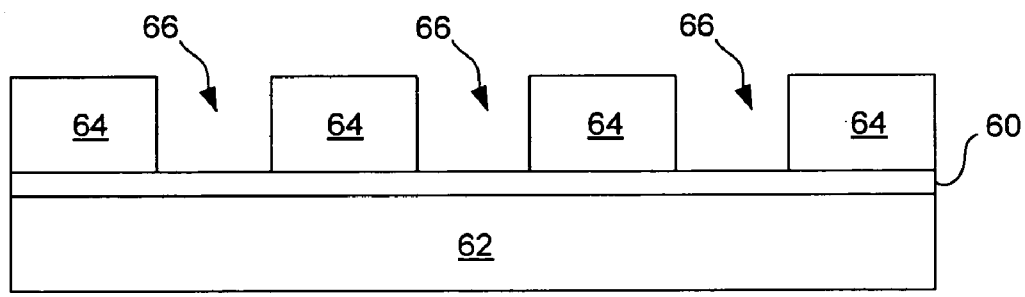

The molding material 64 is then patterned using conventional lithography to form recess regions 66, as illustrated in FIG. 7C. Note the seed layer 60 is exposed at the bottom of the recess regions 66.

Figure 7D:
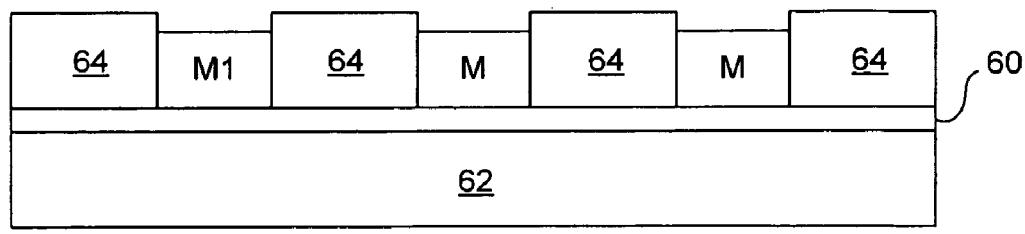

In the next step, the substrate is immersed in an electroplating bath. In the bath, the metal in the plating solution is plated onto the seed layer 60, forming the metal regions M as illustrated in FIG. 7D.

Figure 7E:
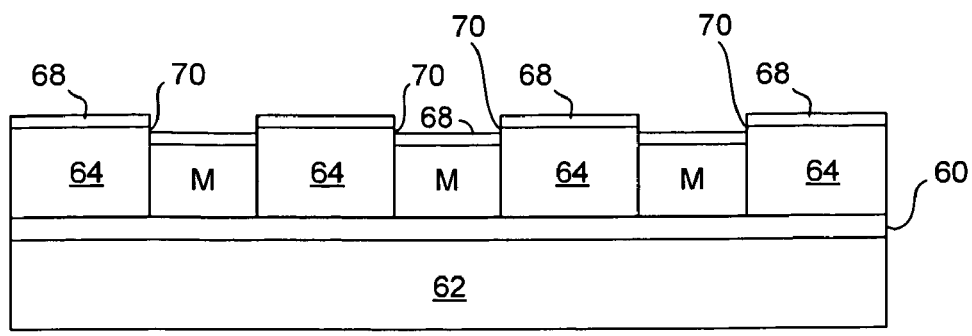

As illustrated in FIG. 7E, optionally, a nitride layer 68 is formed over the remaining molding material 64 and the metal M in the recess regions 66. A "lift off" gap 70 is provided under the nitride layers 68 on the molding material 64. In the next step, the molding material 64 is completely removed by exposure to a solvent through the lift off gaps 70.

Figure 7F:
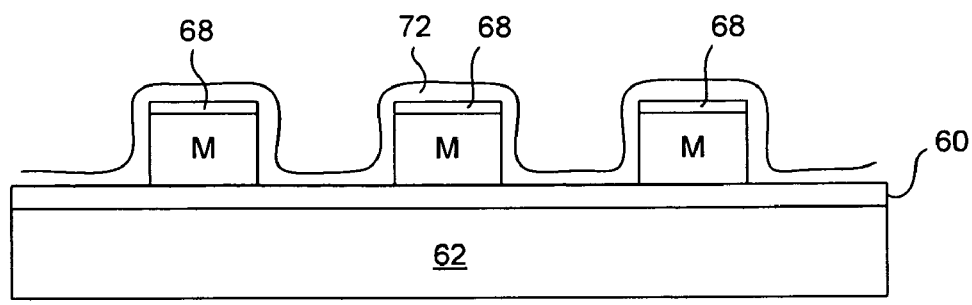

As illustrated in FIG. 7F, a layer of low temperature oxide, nitride or a combination of the two is formed across the surface of the substrate 62, covering the top and side surfaces of the metal regions M.

Figure 7G:
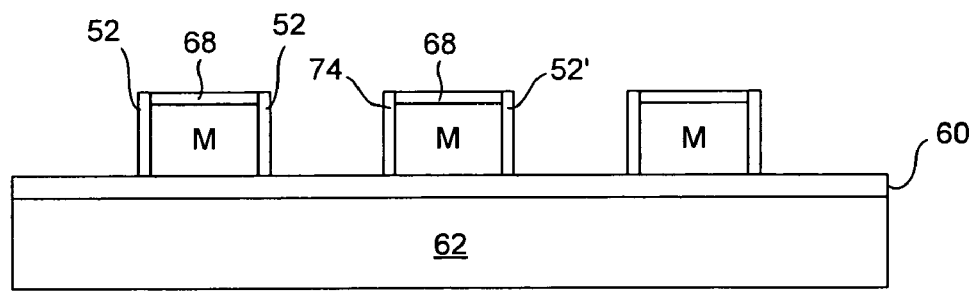

As illustrated in FIG. 7G, a reactive ion anisotropic etch is then performed, which removes the oxide layer 72 and nitride layer 68 on the top surface of the metal regions M. The remaining oxide (or oxide/nitride) on the sidewalls of the metal regions M forms the spacers 52 described above. According to various embodiments, the thickness of the spacers may range from 500 Angstroms to 10 microns. The creation of the spacers 52 thus uses a novel processing scheme to electroplate the core elements in two stages on either side of the spacers, with the core elements sharing the electroplating seed layer.

Figure 7H:
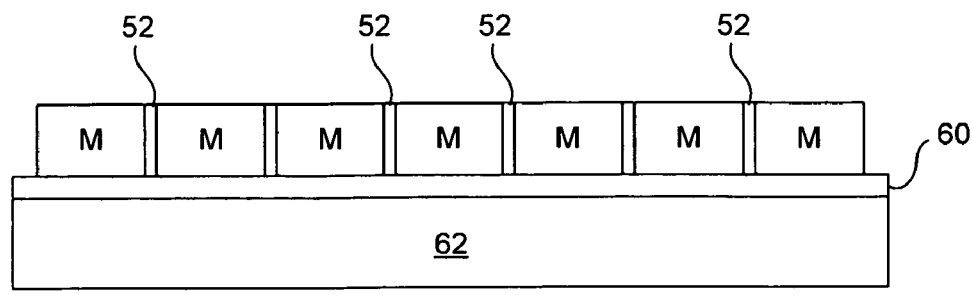

In a final step as illustrated in FIG. 7H, the substrate undergoes a second plating bath, forming additional metal regions M, each separated by a spacer 52. The second metal regions M are thus self-aligned with the original metal regions M1 by the spacer 52.

The aforementioned process can be used to create the core elements 50 of the core array 40 as illustrated in FIGS. 4A through 4D. In other words, the process can be used to make core elements 50 of different or the same lengths and widths, in a uniform or staggered pattern, or of different metals (i.e., M1 and M2). In embodiments using two different metals, the core elements 50 of the first metal M1 are plated during the first electroplating operation and the core elements 50 of the second metal M2 are plated during the second plating operation. Similarly, the core members 50a and 50b can be formed using the same technique. After the lower members 50b are fabricated on the substrate, the windings 38 are formed by a copper metallization step. Thereafter, the above process is again repeated to form the upper members 50a. A dielectric layer is typically provided between the core members 50a, 50b and the winding 38 so that they are each electrically isolated from one another respectively. In various embodiments, the metals M1 and M2 may include a nickel-iron permalloy (80:20) or Orthonol (50:50); ZrCo, FeNiSi, FeNiCu, FeCo, CoMnZnFeNi, FeNiCo, or doped and non-doped combinations thereof.

While this invention has been described in terms of several preferred embodiments, there are alteration, permutations, and equivalents, which fall within the scope of this invention. It should also be noted that there are many alternative ways of implementing the methods and apparatuses of the present invention. For example, the steps of the present invention may be used to form a plurality of high value inductors 10 across many die on a semiconductor wafer. It is therefore intended that the following appended claims be interpreted as including all such alterations, permutations, and equivalents as fall within the true spirit and scope of the present invention.

What is claimed is:

1. A method of forming an array of inductor core elements on a semiconductor substrate that includes integrated circuits, the method comprising:

forming a first set of spaced apart metallic core elements over the substrate;

forming isolation sidewalls on side surfaces of the core elements;

forming a second set of metallic core elements over the substrate after the formation of the isolation sidewalls, the first and second set of metallic core elements forming an inductor core element array, wherein:
the first and second sets of core elements are substantially co-planar and interleaved such that only the isolation sidewalls separate adjacent core elements;
the semiconductor substrate is a wafer having a multiplicity of dice formed thereon; and
a multiplicity of inductor core arrays are simultaneously formed on the wafer such that each die has an inductor core array formed thereon.

2. The method as recited in claim 1 wherein the forming of the isolation sidewalls includes:
depositing a conformal isolation layer over the substrate after the first set of core elements have been formed so that the isolation layer covers top and side surfaces of the first set of core elements and regions of the substrate between core elements in the first set of core elements; and
etching away portions of the isolation layer that cover the substrate in regions between core elements in the first set of core elements without removing the isolation sidewalls.

3. The method as recited in claim 2 wherein the etching also removes portions of the isolation layer that cover top surfaces of the first set of core elements.

4. The method as recited in claim 1 wherein the first set of core elements is formed by:
applying a metal seed layer over the substrate;
depositing a layer of photoresist over the metal seed layer;
patterning the photoresist using lithographic techniques to form recesses in the photoresist that expose portions of the metal seed layer; and
depositing a first metal material onto into the recesses to form the first set of core elements.

5. The method as recited in claim 4 wherein the applying of the metal seed layer over the substrate is performed prior to the formation of the first set of core elements and wherein the first metal material is deposited by electroplating.

6. The method as recited in claim 1 wherein different metal compositions are used to create the first and second sets of core elements such that the first and second sets of core elements have different magnetic coercivities.

7. The method as recited in claim 6 wherein the widths of core elements within at least one of the first and second sets of core elements vary.

8. The method as recited in claim 1 wherein the first and second sets of core elements are formed from the same materials.

9. The method as recited in claim 1 further comprising forming inductor windings arranged to interact with the inductor core element array.

10. The method as recited in claim 9, wherein the inductor windings are formed before the forming of the inductor core element array.

11. The method as recited in claim 1 wherein the thickness of the isolation sidewalls ranges from approximately 500 Angstroms to approximately 10 microns.

12. A method of forming an array of inductor core elements on a semiconductor substrate that includes integrated circuits, the method comprising:
forming a first set of spaced apart metallic core elements over the substrate;
forming isolation sidewalls on side surfaces of the core elements; and
forming a second set of metallic core elements over the substrate after the formation of the isolation sidewalls, wherein the first and second sets of core elements are substantially co-planar and interleaved such that only the isolation sidewalls separate adjacent core elements and wherein the first and second sets of core elements are formed from ferromagnetic materials wherein different metal compositions of the ferromagnetic materials are used to create the first and second sets of core elements such that the first and second sets of core elements have different magnetic coercivities.

13. The method as recited in claim 12 wherein:
the semiconductor substrate is a wafer having a multiplicity of dice formed thereon; and
a multiplicity of inductor core arrays are simultaneously formed on the wafer such that each die has an inductor core array formed thereon.

14. A method of forming an array of inductor core elements on a semiconductor substrate that includes integrated circuits, the method comprising:
forming a first set of spaced apart metallic core elements over the substrate;
forming isolation sidewalls on side surfaces of the core elements, wherein the forming of the isolation sidewalls includes:
depositing a conformal isolation layer over the substrate after the first set of core elements have been formed so that the isolation layer covers top and side surfaces of the first set of core elements and regions of the substrate between core elements in the first set of core elements; and
etching away portions of the isolation layer that cover the substrate in regions between core elements in the first set of core elements without removing the isolation sidewalls;
forming a second set of metallic core elements over the substrate after the formation of the isolation sidewalls, wherein the first and second sets of core elements are substantially co-planar and interleaved such that only the isolation sidewalls separate adjacent core elements;
after forming the first and second sets of metallic core elements, forming a set of one or more inductor core windings over the first and second sets of metallic core elements;
forming a third set of spaced apart inductor core elements over the set of inductor core windings;
forming isolation sidewalls on side surfaces of the third set of inductor core elements; and
forming a fourth set of metallic core elements over the inductor core windings, wherein the third and fourth sets of core elements are substantially coplanar and interleaved such that only isolation sidewalls separate adjacent core elements.

15. A method of forming an array of inductor core elements on a semiconductor substrate that includes integrated circuits, the method comprising:
forming a metal seed layer over the substrate;
depositing a layer of photoresist over the metal seed layer;
patterning the photoresist using lithographic techniques to form recesses in the photoresist that expose portions of the metal seed layer;
electroplating a first metal material into the recesses to form a first set of spaced apart core elements;
depositing a conformal isolation layer over the substrate after the first set of core elements have been formed so that the isolation layer covers top and side surfaces of the first set of core elements and regions of the substrate between core elements in the first set of core elements, thereby forming isolation sidewalls on each of the first set of core elements;

etching away portions of the isolation layer that cover the substrate in regions between core elements in the first set of core elements to expose portions of the metal seed layer without removing the isolation sidewalls; and electroplating a second metal material after the isolation layer etching to form a second set of metallic core elements, wherein the first and second sets of core elements are substantially co-planar and interleaved such that only the isolation sidewalls separate adjacent core elements, wherein the first and second metal materials are ferromagnetic materials.

16. The method as recited in claim 15 wherein different metal compositions are used to create the first and second sets of core elements such that the first and second sets of core elements have different magnetic coercivities.

17. The method as recited in claim 15 wherein the first and second sets of core elements are formed from the same materials.

18. A method of forming an array of inductor core elements on a semiconductor substrate that includes integrated circuits, the method comprising:

forming a metal seed layer over the substrate;

depositing a layer of photoresist over the metal seed layer;

patterning the photoresist using lithographic techniques to form recesses in the photoresist that expose portions of the metal seed layer;

electroplating a first metal material into the recesses to form a first set of spaced apart core elements;

depositing a conformal isolation layer over the substrate after the first set of core elements have been formed so that the isolation layer covers top and side surfaces of the first set of core elements and regions of the substrate between core elements in the first set of core elements, thereby forming isolation sidewalls on each of the first set of core elements;

etching away portions of the isolation layer that cover the substrate in regions between core elements in the first set of core elements to expose portions of the metal seed layer without removing the isolation sidewalls;

electroplating a second metal material after the isolation layer etching to form a second set of metallic core elements, wherein the first and second sets of core elements are substantially co-planar and interleaved such that only the isolation sidewalls separate adjacent core elements; and applying an insulating layer over the first set of core elements and the photoresist before the isolation sidewalls are formed, wherein portions of the insulating layer that cover the first set of core elements are left in place during the electroplating of the second metal material.

19. A method of forming an array of inductor core elements on a semiconductor substrate that includes integrated circuits, the method comprising:

forming a metal seed layer over the substrate;

depositing a layer of photoresist over the metal seed layer;

patterning the photoresist using lithographic techniques to form recesses in the photoresist that expose portions of the metal seed layer;

electroplating a first metal material into the recesses to form a first set of spaced apart core elements;

forming a nitride layer over the patterned photoresist and the first set of core elements, there being a gap under portions of the nitride layer that overlie the patterned photoresist;

removing the patterned photoresist at least in part by exposing the patterned photoresist to a solvent via the gap depositing a conformal isolation layer over the substrate after the first set of core elements have been formed so that the isolation layer covers top and side surfaces of the first set of core elements and regions of the substrate between core elements in the first set of core elements, thereby forming isolation sidewalls on each of the first set of core elements;

etching away portions of the isolation layer that cover the substrate in regions between core elements in the first set of core elements to expose portions of the metal seed layer without removing the isolation sidewalls; and electroplating a second metal material after the isolation layer etching to form a second set of metallic core elements, wherein the first and second sets of core elements are substantially co-planar and interleaved such that only the isolation sidewalls separate adjacent core elements.

20. A method of forming an array of inductor core elements on a substrate that includes, the method comprising:

forming a first set of spaced apart metallic core elements over the substrate;

forming isolation sidewalls on side surfaces of the core elements;

forming a second set of metallic core elements over the substrate after the formation of the isolation sidewalls, the first and second set of metallic core elements forming an inductor core element array, wherein:

at least one core element in the second set of core elements is positioned in a space between an associated adjacent pair of core elements in the first set of core elements;

the semiconductor substrate is a wafer having a multiplicity of dice formed thereon; and a multiplicity of inductor core arrays are simultaneously formed on the wafer such that each die has an inductor core array formed thereon.

21. The method as recited in claim 20 wherein each core element in the second set of core elements that is positioned between an associated adjacent pair of first core elements substantially fills a gap between the associated adjacent pair of first core elements such that only the isolation sidewalls separate adjacent core elements from the first and second sets of core elements.

22. The method as recited in claim 20 wherein members of the first and second sets of core elements are substantially co-planar and interleaved such that only the isolation sidewalls separate adjacent core elements.

23. The method as recited in claim 20 wherein different metal compositions are used to create the first and second sets of core elements such that the first and second sets of core elements have different magnetic coercivities.

* * * * *